Figure 1:
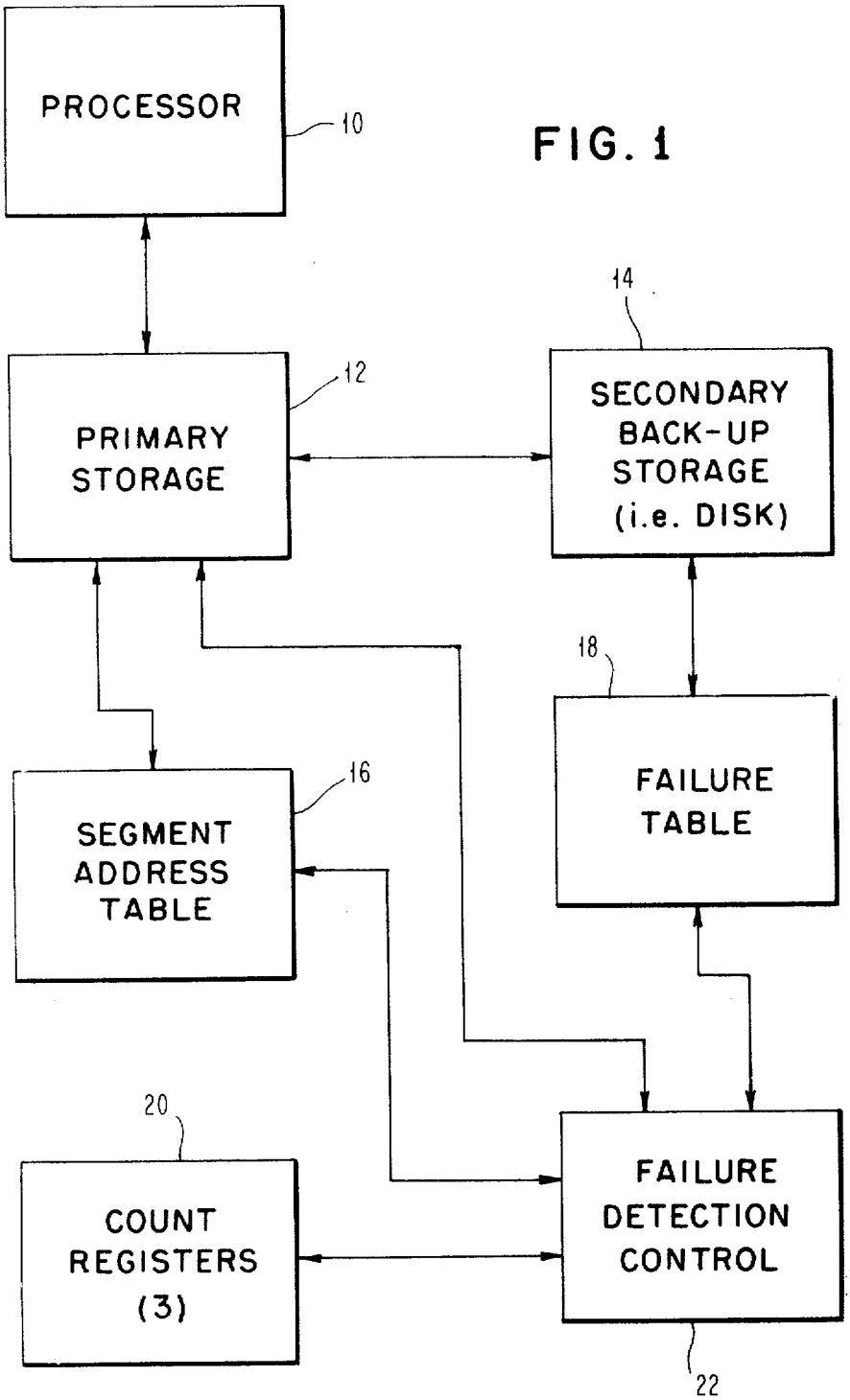
Figure 2:
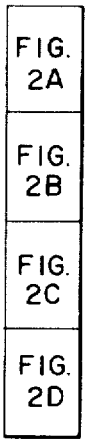
Figure 2A:
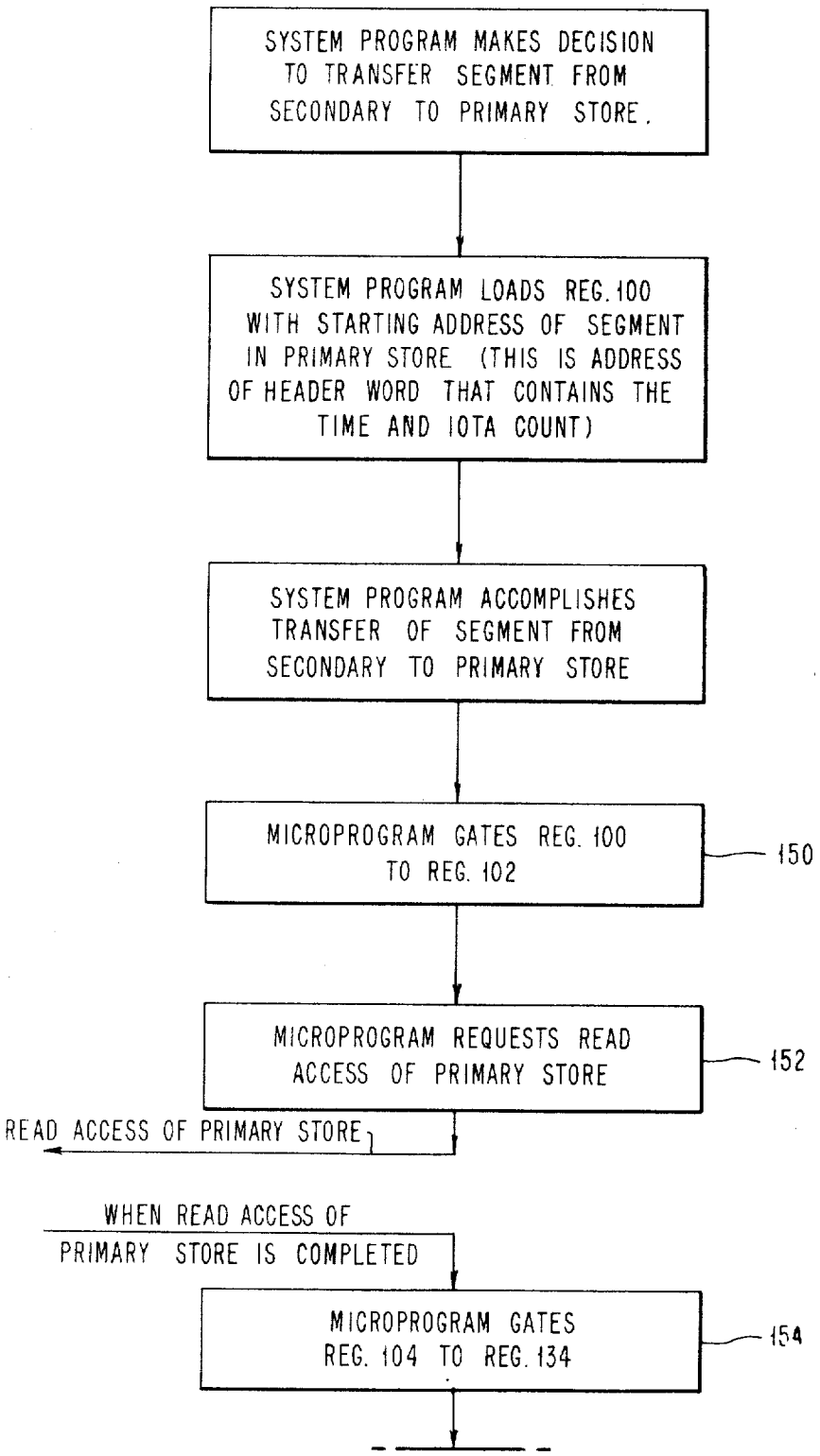
Figure 2B:
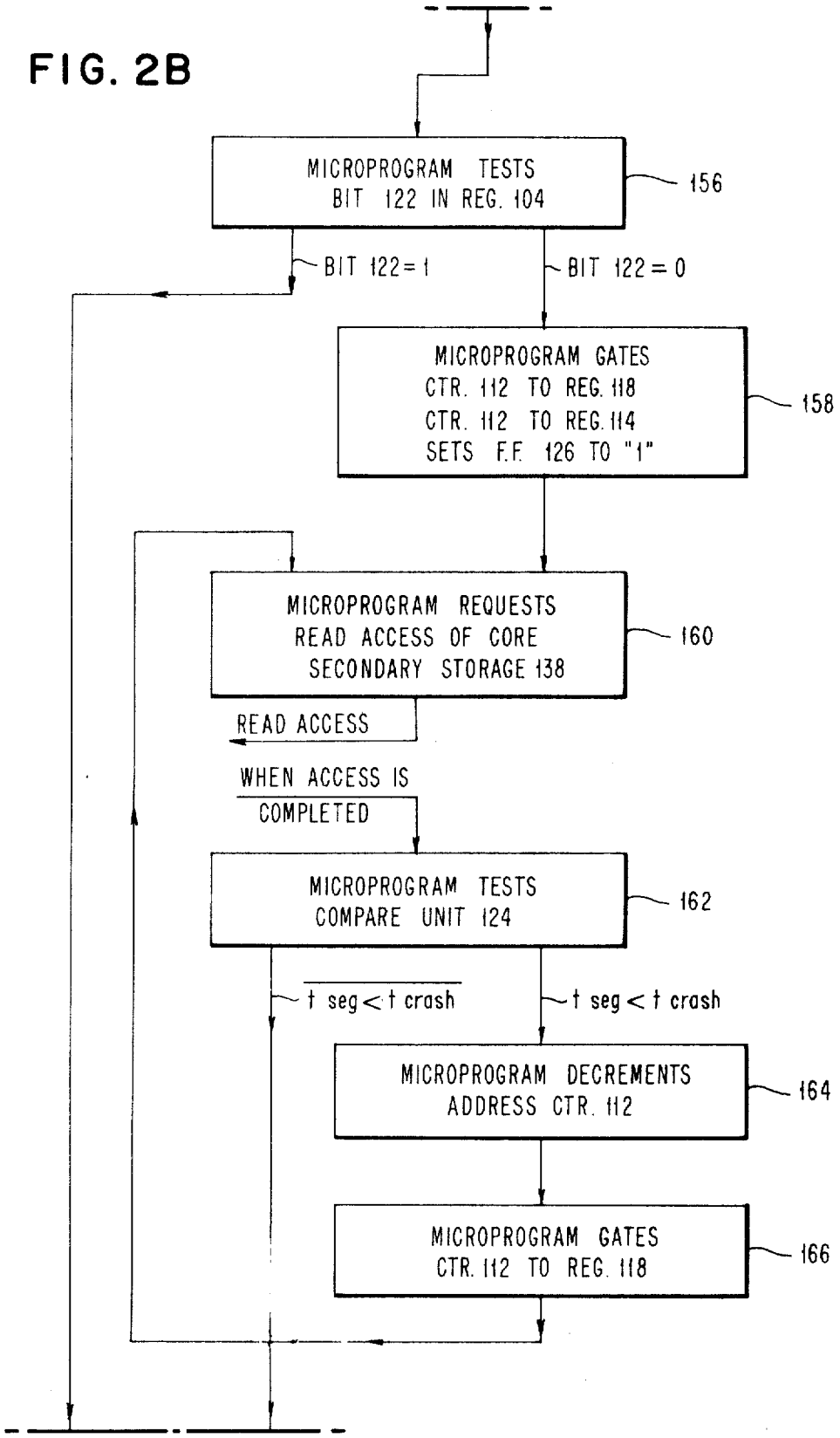
Figure 2C:
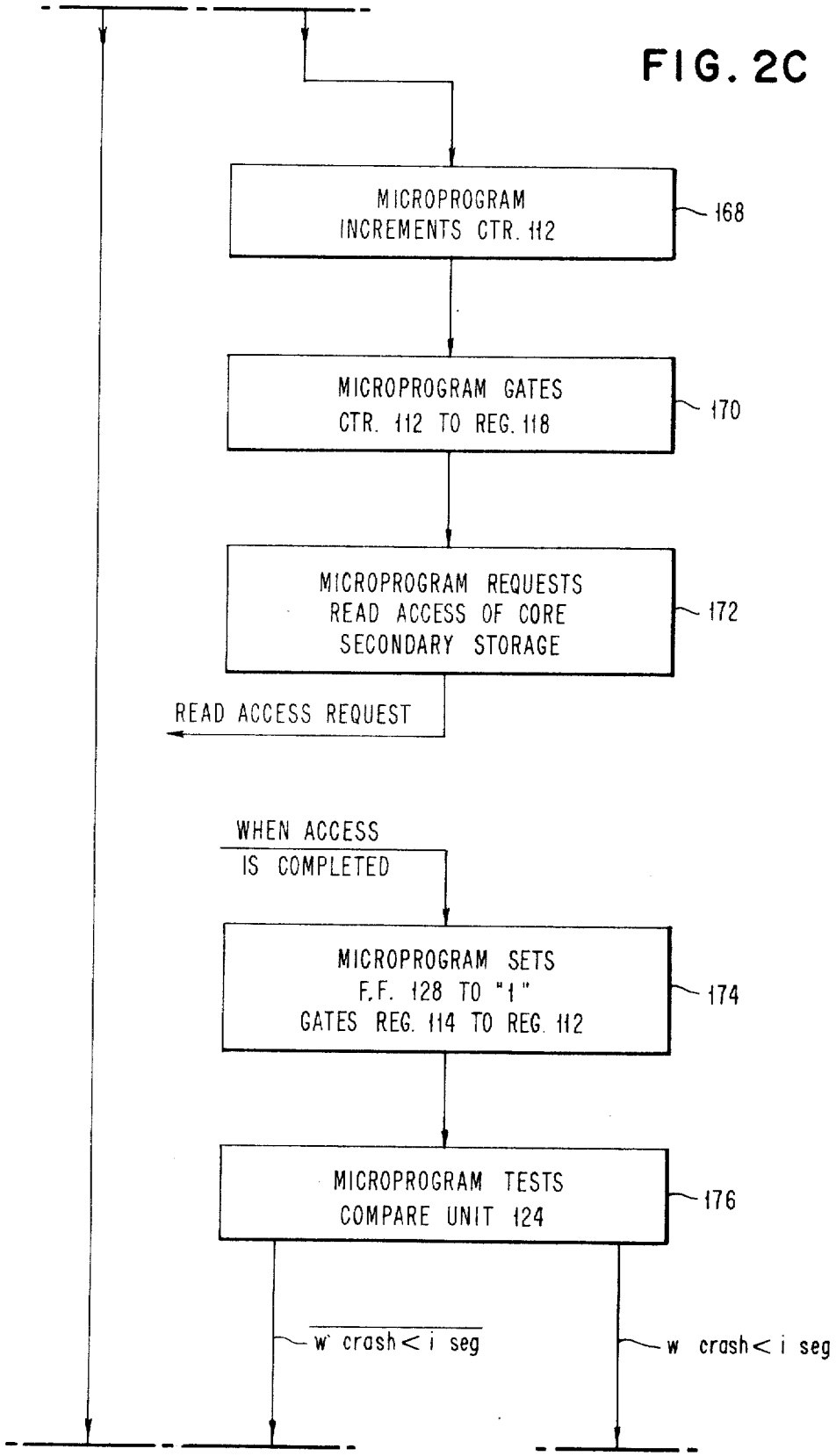
Figure 2D:
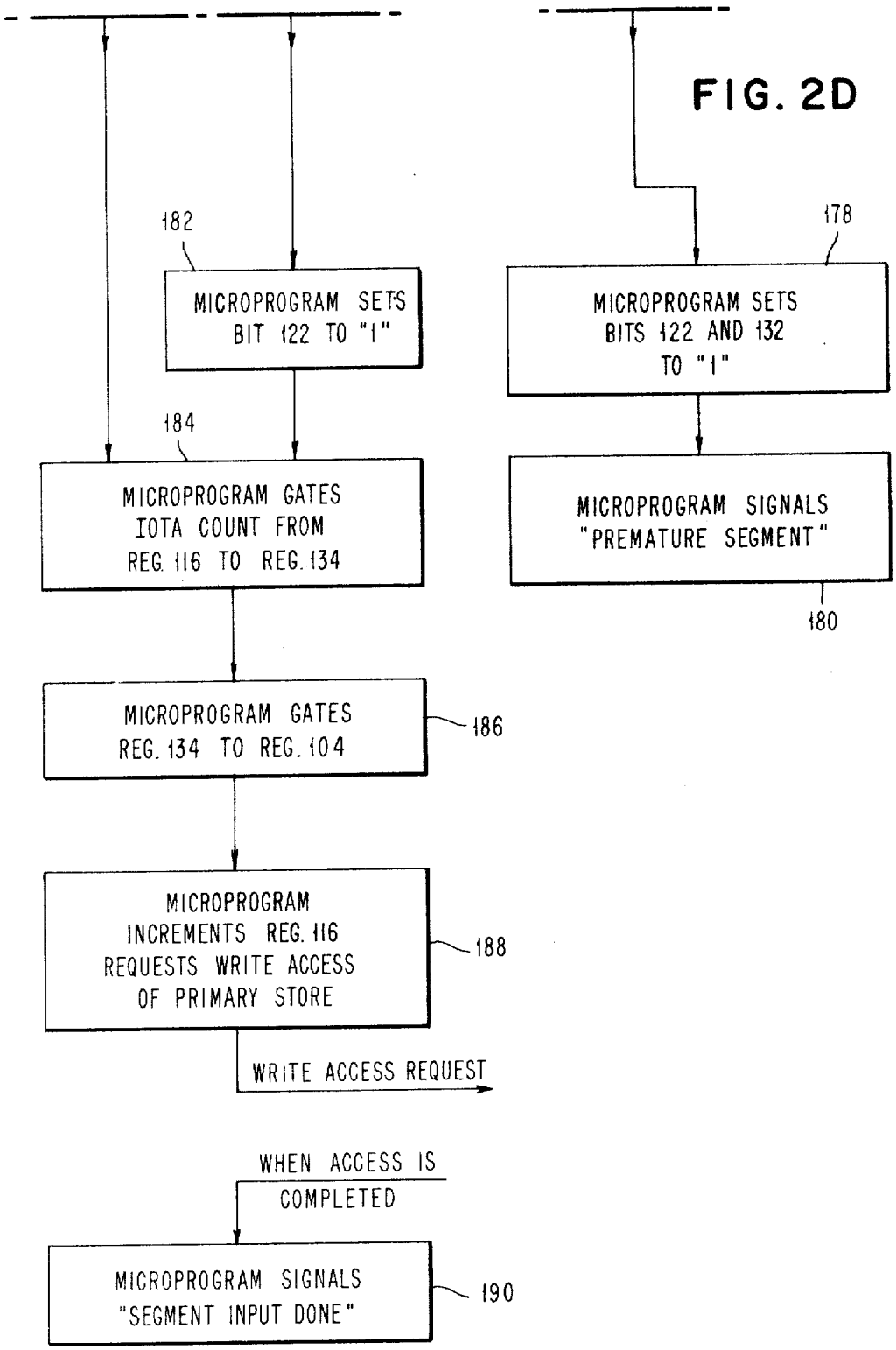
Figure 3C:
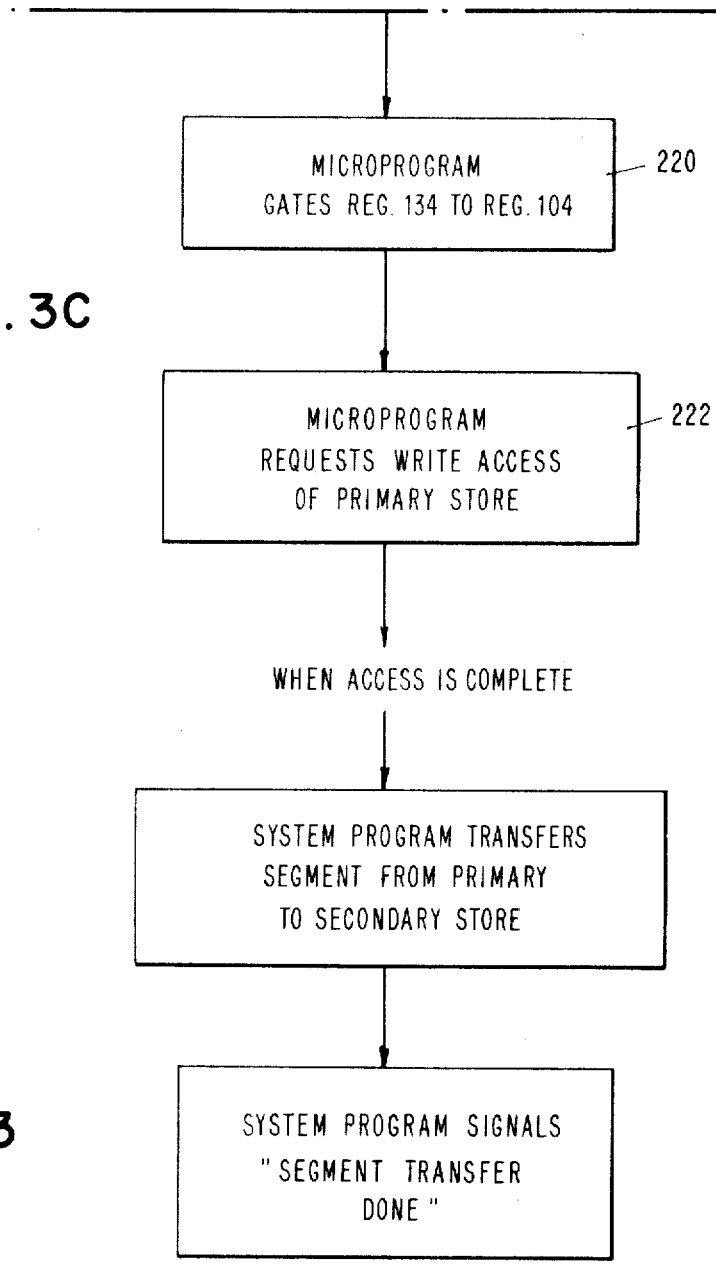
Figure 3:
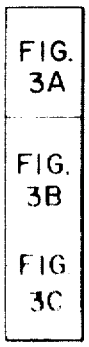
Figure 3A:
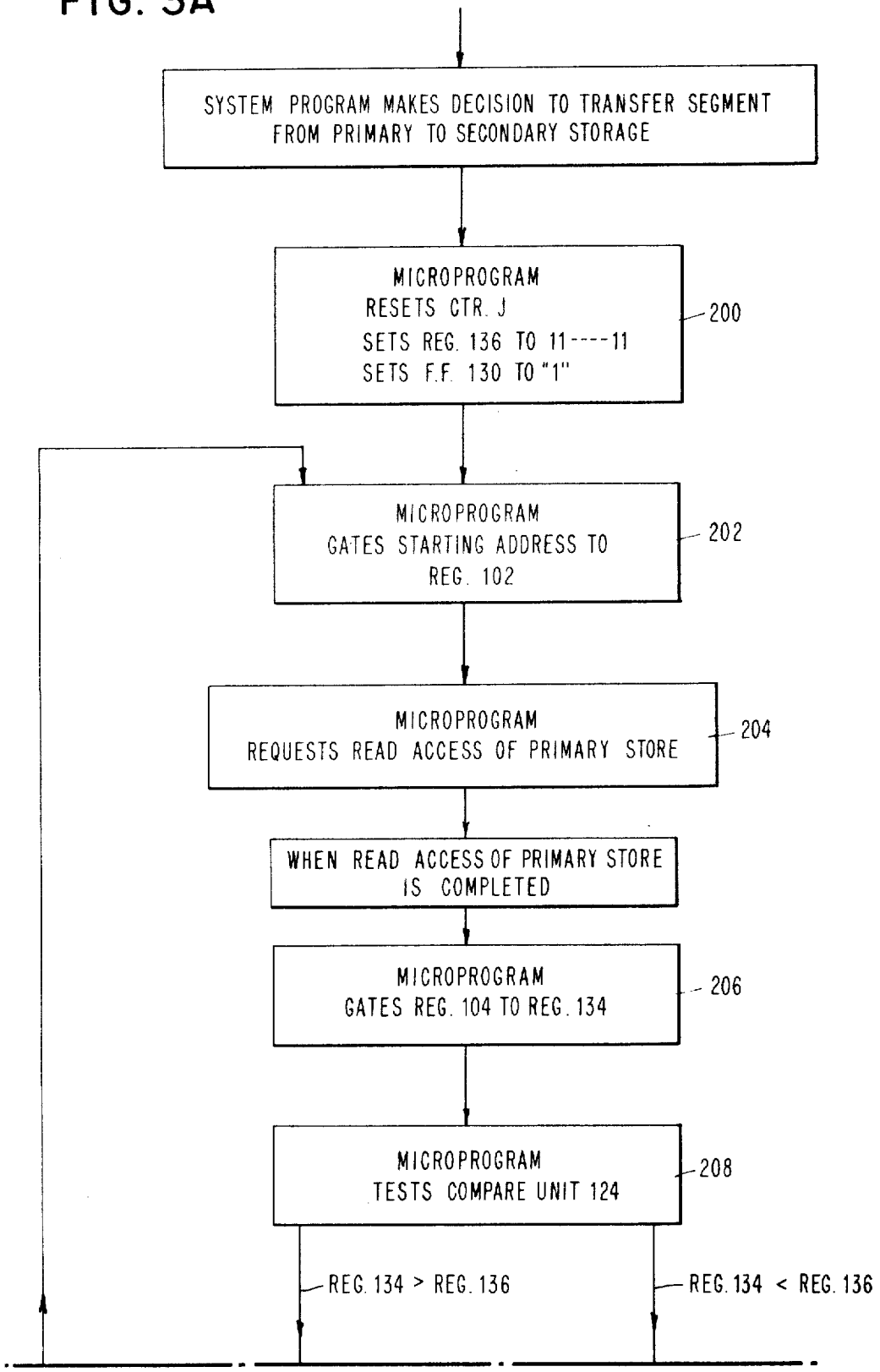
Figure 3B:
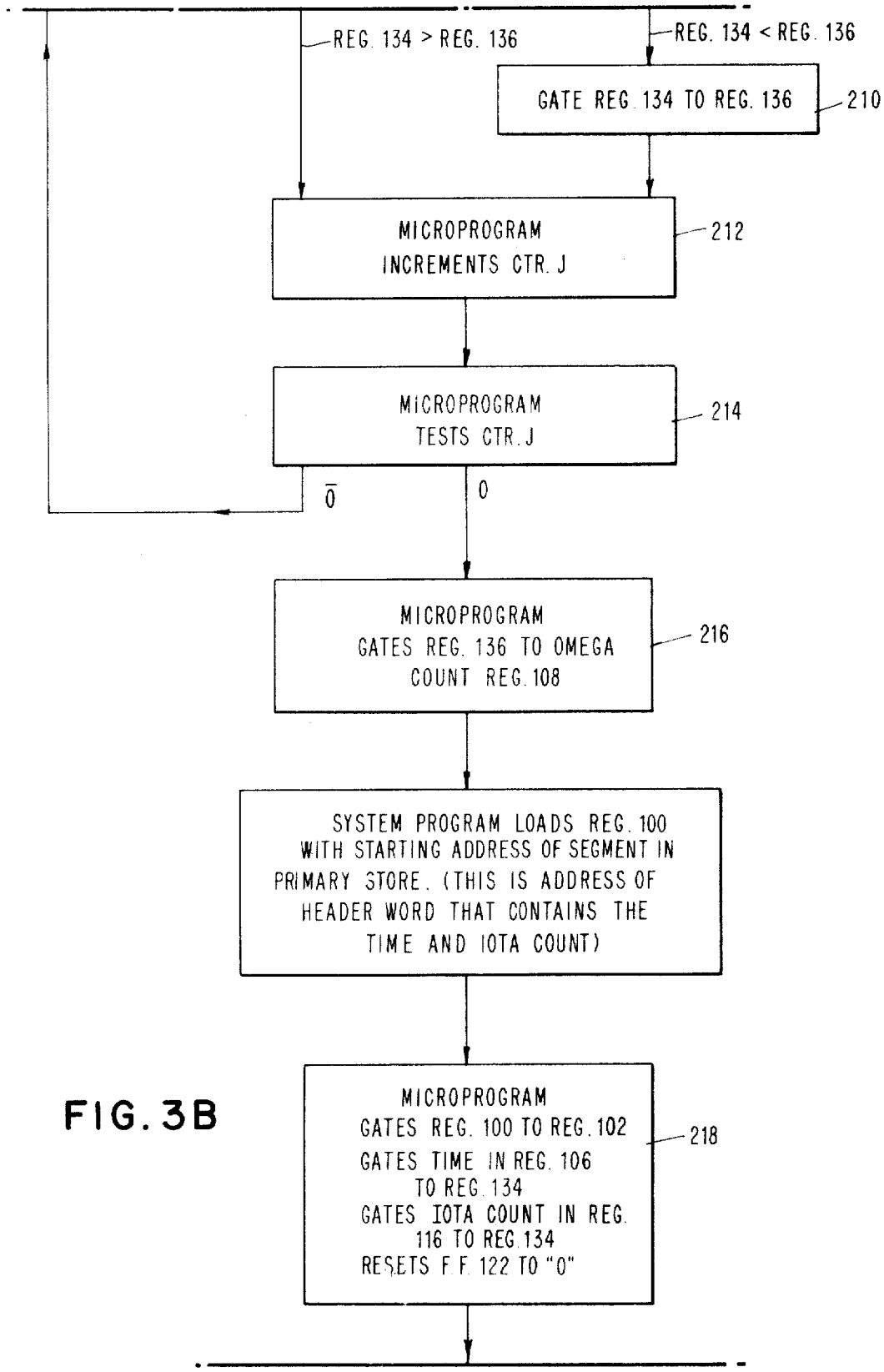
Figure 4:
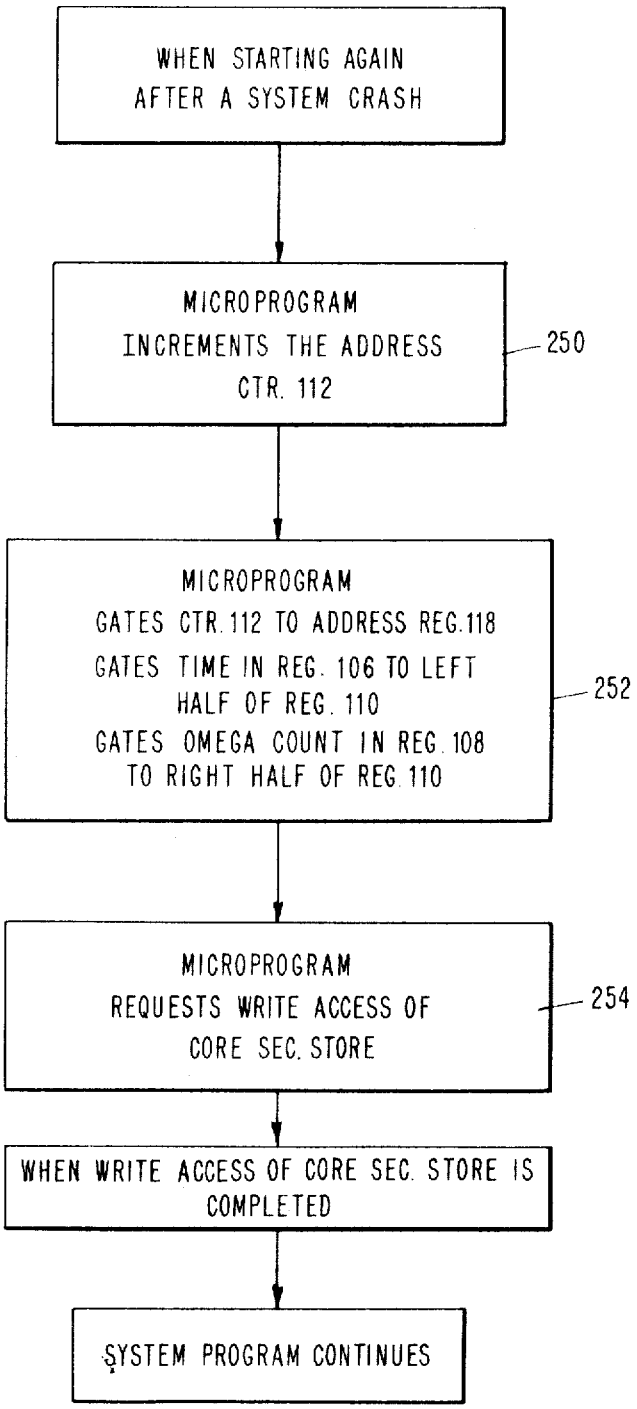
Figures 5, 5F:
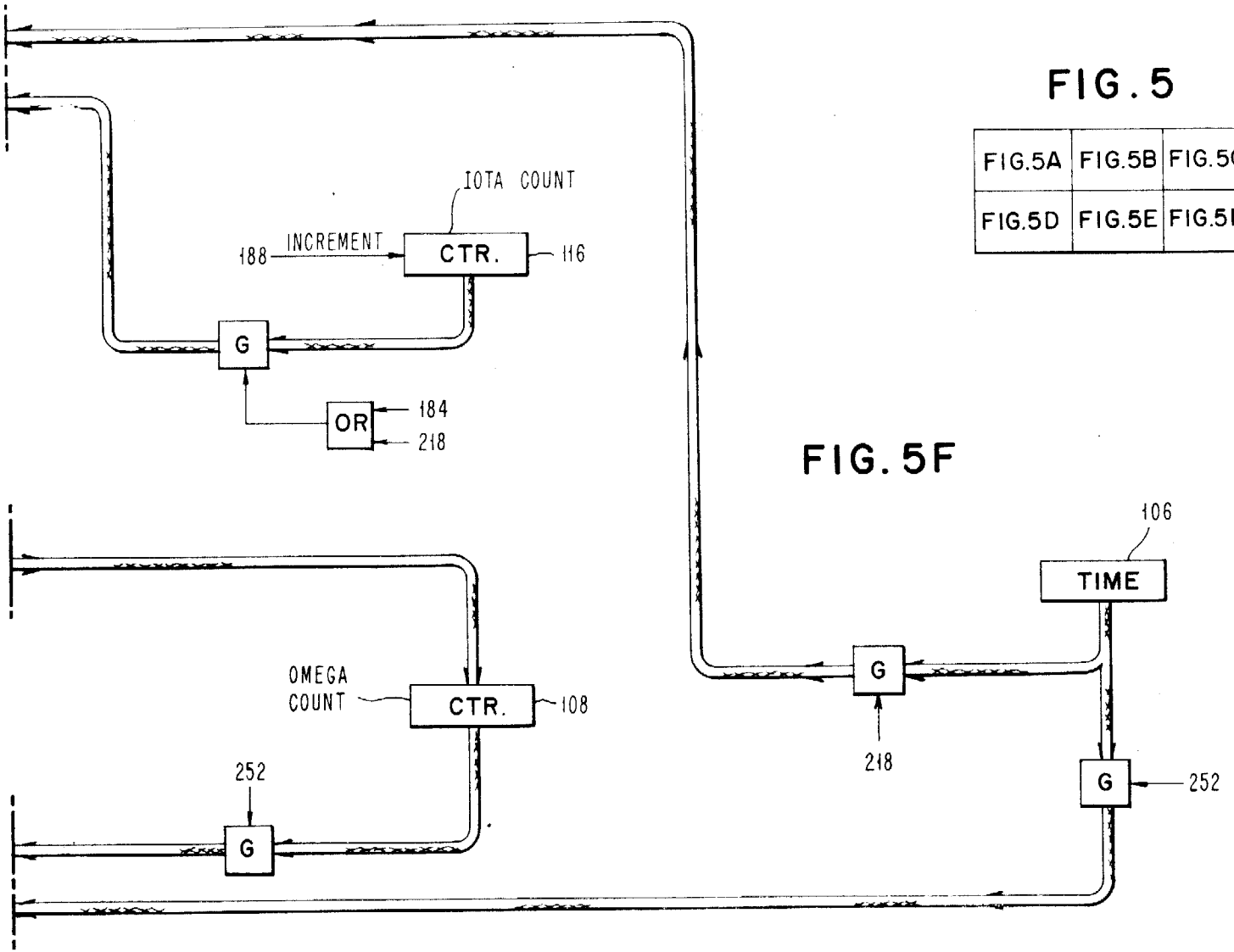
Figure 5A:
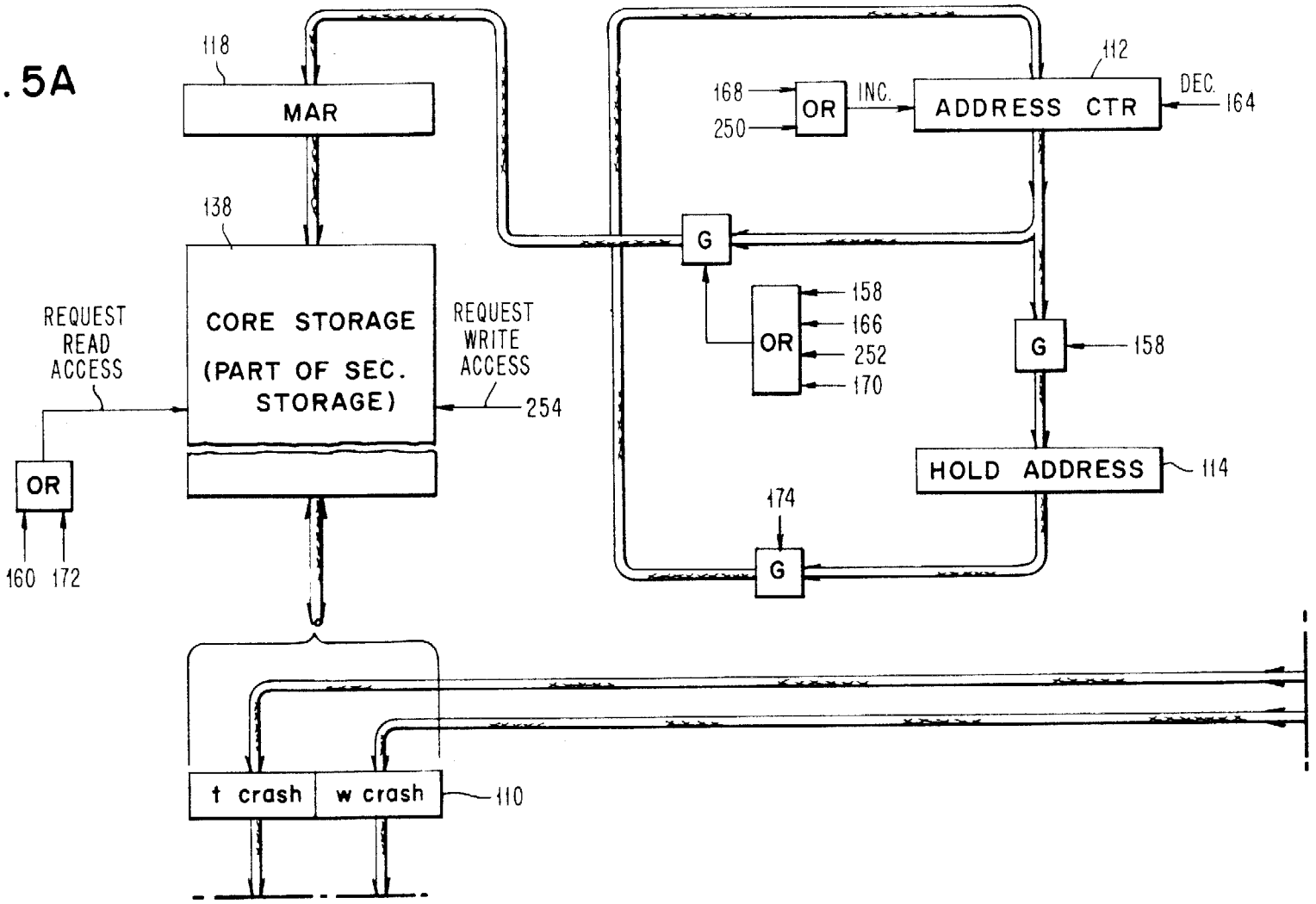
Figure 5B:
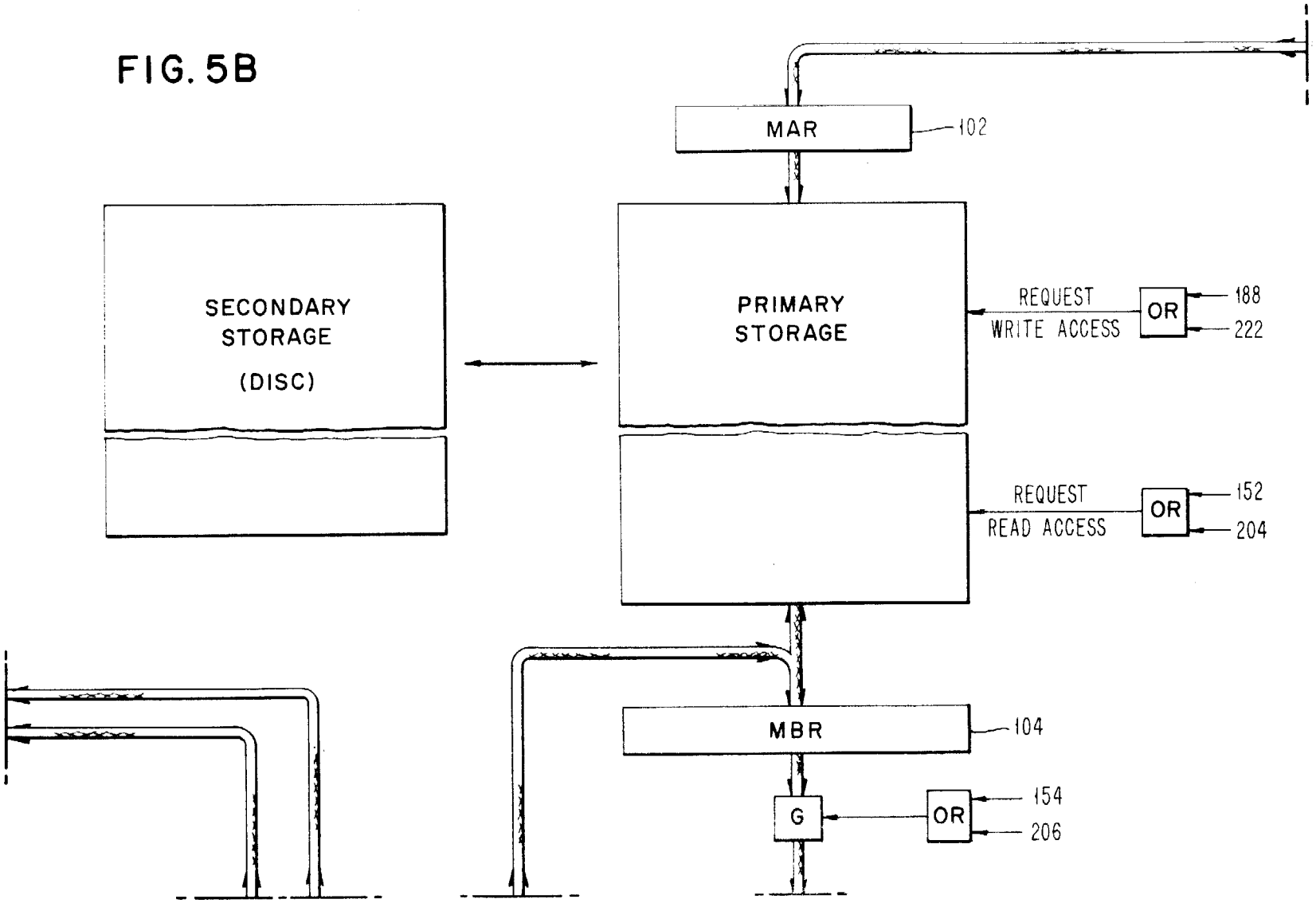
Figure 5C:
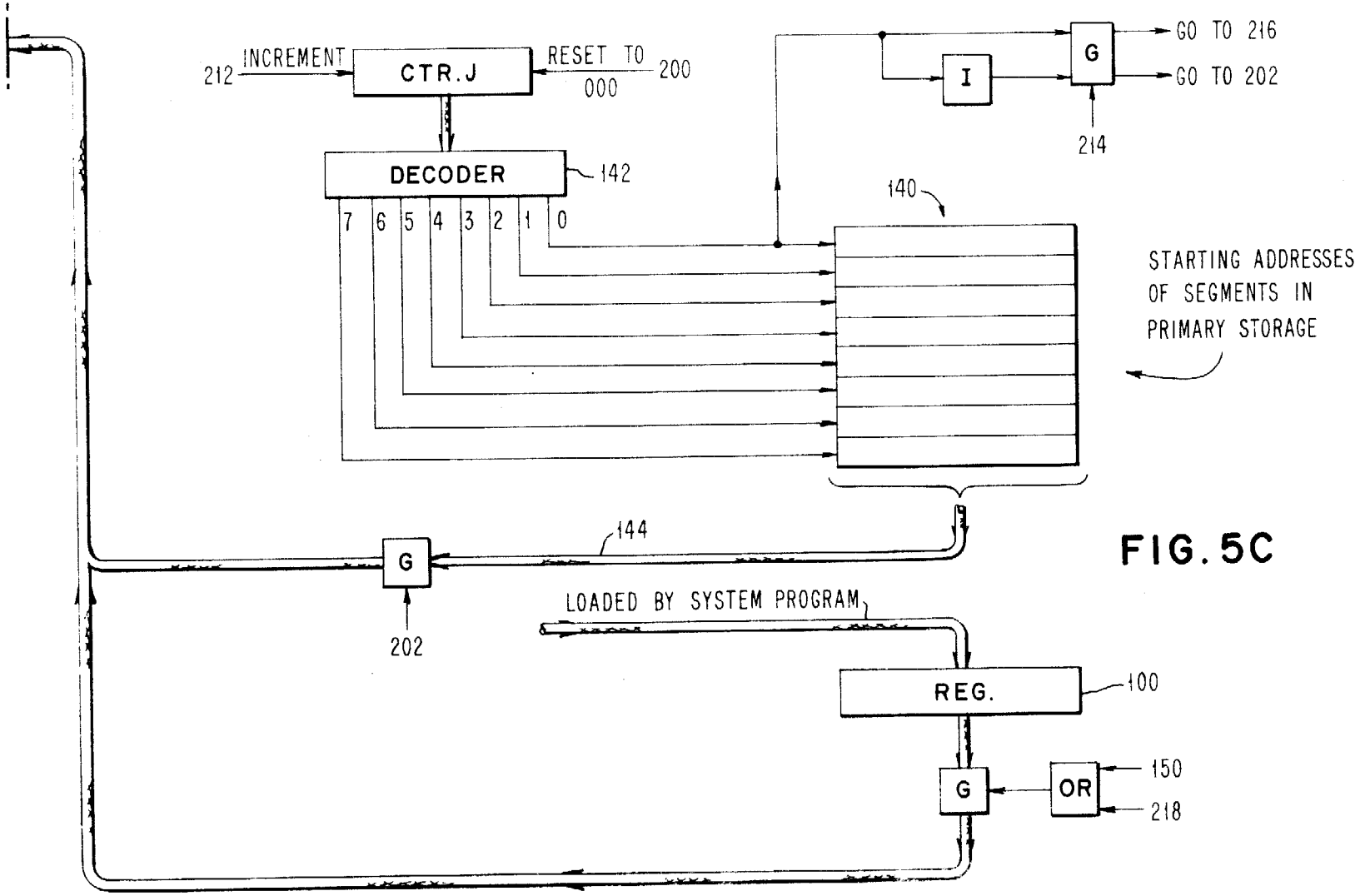
Figure 5D:
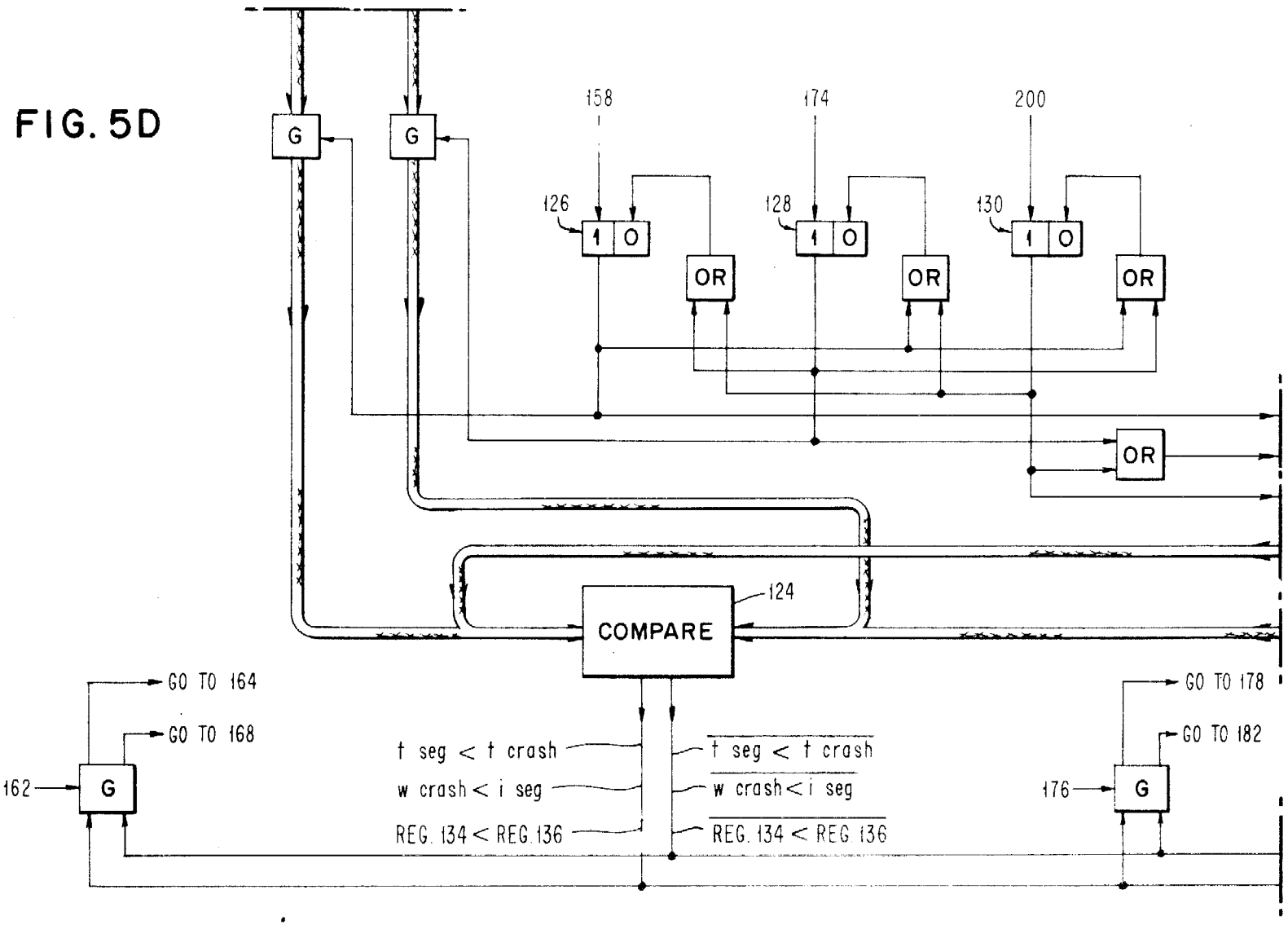
Figure 5E:
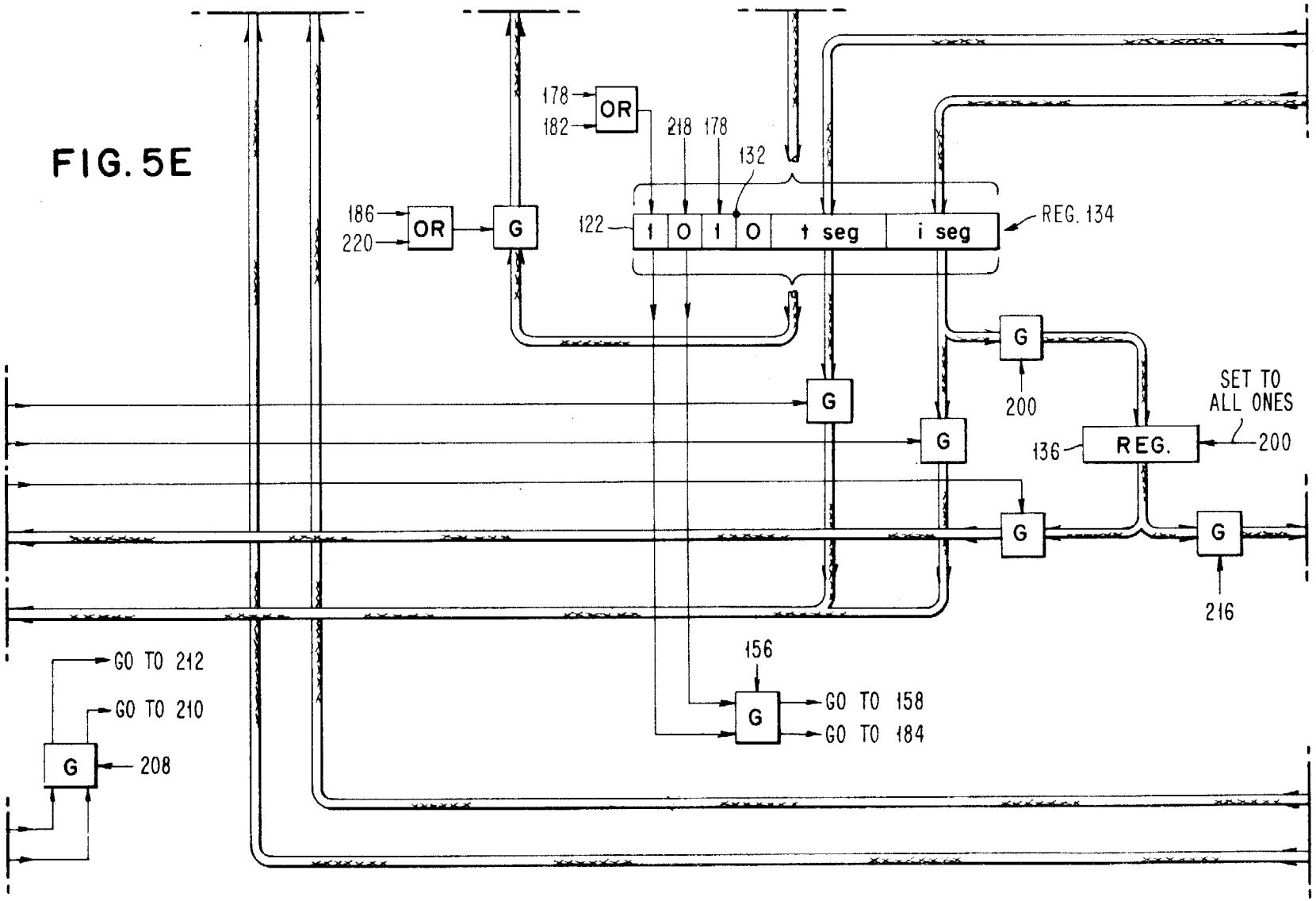

DEFENSIVE PUBLICATION

UNITED STATES PATENT AND TRADEMARK OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent and Trademark Office makes no assertion as to the novelty of the disclosed subject matter.

PUBLISHED MARCH 4, 1975

932 O.G. 10

T932,005

DETECTION OF POSSIBLY ERRONEOUS SEGMENTS FOLLOWING FAILURES IN PRIMARY STORAGE

Vincent J. Kruskal, Ossining, N.Y., assignor to International Business Machines Corporation, Armonk, N.Y.

Filed Dec. 28, 1973, Ser. No. 429,303
Int. Cl. G06f *11/06;* G11c *29/00*
U.S. Cl. 235—153 AM
15 Sheets Drawing. 23 Pages Specification

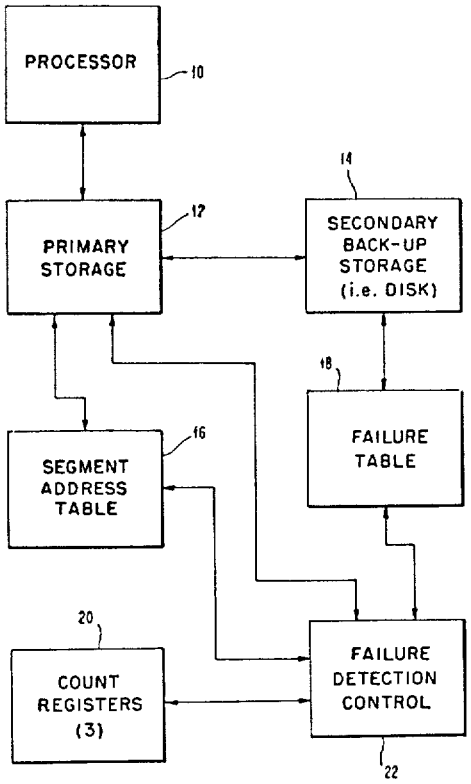

A method for detecting possibly erroneous memory segments in a hierarchical memory system having at least a primary and secondary back-up memory following failure in the primary storage of said system. The method generally includes keeping certain statistical data concerning the transfer of data segments into and out of said primary storage whereby automatic validity checking procedures can be performed to determine the probable accuracy of the current contents of said primary memory.

182
MICROPROGRAM SETS BIT 122 TO "1"
178
MICROPROGRAM SETS BITS 122 AND 132 TO "1"
184
MICROPROGRAM GATES IOTA COUNT FROM REG. 116 TO REG. 134
MICROPROGRAM SIGNALS "PREMATURE SEGMENT"
180
MICROPROGRAM GATES REG. 134 TO REG. 104
186
MICROPROGRAM INCREMENTS REG. 116 REQUESTS WRITE ACCESS OF PRIMARY STORE
188
WRITE ACCESS REQUEST
WHEN ACCESS IS COMPLETED
MICROPROGRAM SIGNALS "SEGMENT INPUT DONE"
190

| | |
|---|---|
| FIG.5A | FIG.5B | FIG.5C |
| FIG.5D | FIG.5E | FIG.5F |